(12) United States Patent
Kim

(10) Patent No.: US 7,843,223 B1
(45) Date of Patent: Nov. 30, 2010

(54) SEMICONDUCTOR DEVICE

(75) Inventor: Yong-Hoon Kim, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 12/494,748

(22) Filed: Jun. 30, 2009

(30) Foreign Application Priority Data

Jun. 5, 2009 (KR) .................... 10-2009-0049815

(51) Int. Cl.
*H03K 19/0175* (2006.01)
*H03K 19/0185* (2006.01)

(52) U.S. Cl. .................... 326/82; 326/87; 327/108; 365/189.05

(58) Field of Classification Search ............ 326/82, 326/83, 86, 87; 327/108, 112; 365/189.05
See application file for complete search history.

(56) References Cited

U.S. PATENT DOCUMENTS 5,999,055 A * 12/1999 Kimura ................. 330/255

* cited by examiner

*Primary Examiner*—Daniel D Chang
(74) *Attorney, Agent, or Firm*—IP & T Group LLP

(57) ABSTRACT

A semiconductor device includes a buffer unit configured to include first and second buffers, connected to each other in a cross-coupled manner, to receive a reference voltage and to buffer an input signal applied to the first and second buffers based on the reference voltage to drive an output terminal with a current-driving capacity; and a drive power adjustor configured to adjust the current-driving capacity depending on a level of a power supply voltage applied to the buffering unit.

12 Claims, 4 Drawing Sheets

SEMICONDUCTOR DEVICE

CROSS-REFERENCE TO RELATED APPLICATIONS

The present application claims priority of Korean patent application number 10-2009-0049815, filed on Jun. 5, 2009, the disclosure of which is incorporated by reference in its entirety.

BACKGROUND OF THE INVENTION

The present invention relates to a semiconductor design technology, and more particularly, to a semiconductor device having buffers for buffering and outputting an input signal.

Generally, semiconductor devices, including Double Data Rate SDRAM Synchronous Dynamic Random Access Memory (DDR SDRAM), perform write and read operations in response to a data signal, an address signal, and an external command signal from an external chipset. These signals are usually buffered by an input buffer provided within the semiconductor device and then inputted to various elements therein.

FIG. 1 is a circuit diagram for explaining a conventional buffer.

Referring to FIG. 1, the conventional buffer includes a signal input unit 110, an activation unit 130, and a current source unit 150.

The signal input unit 110 is for receiving a reference voltage V_REF and an input signal IN, and is provided with a first NMOS transistor NM1 for receiving the reference voltage V_REF via its gate, and a second NMOS transistor NM2 for receiving the input signal IN via its gate. Here, the reference voltage V_REF generally has a ½ level of a power supply voltage VDD, and is supplied as an internal power supply voltage generated from it.

The activation unit 130 is for activating the signal input unit 110 in response to an activation signal EN, and is provided with a third NMOS transistor NM3 for receiving the activation signal EN via its gate.

The current source unit 150 is for driving an output terminal OUT based on the reference voltage V_REF and the input signal IN, and is provided with first and second PMOS transistors PM1 and PM2.

Hereinafter, the operation of the general buffer will be briefly described. For illustration purposes, it is assumed that the buffering operation of the buffer is activated when the activation signal EN is activated to logic 'high'.

As such, with the buffer being activated, when the input signal IN is logic 'high', i.e., the input signal IN has a higher voltage level than the reference voltage V_REF, Vgs of the second NMOS transistor NM2 becomes larger than Vgs of the first NMOS transistor NM1. That is, the degree to which the second NMOS transistor NM2 is turned on becomes larger than the degree to which the first NMOS transistor NM1 is turned on. Thus, a voltage level of the output terminal OUT becomes gradually lower.

On the other hand, when the input signal IN is logic 'low', i.e., the input signal IN has a lower voltage level than the reference voltage V_REF, Vgs of the first NMOS transistor NM1 becomes larger than Vgs of the second NMOS transistor NM2. That is, the degree to which the first NMOS transistor NM1 is turned on becomes larger than the degree to which the second NMOS transistor NM2 is turned on. Thus, a voltage level of the drain terminal of the first NMOS transistor NM1 becomes lower, and a voltage level of the gate terminal of the second PMOS transistor MP2 becomes also lower. Accordingly, a voltage level of the output terminal OUT becomes gradually higher. As a result, the general buffer lowers a voltage level of the output terminal OUT when a voltage level of the input signal IN is higher than the reference voltage V_REF, and raises a voltage level of the output terminal OUT when a voltage level of the input signal IN is lower than the reference voltage V_REF.

Meanwhile, the level of the power supply voltage applied to the semiconductor device may vary depending on chipset used, and the semiconductor device should be designed so that it may perform a desired operation even at various levels of the power supply voltage VDD. That is, the semiconductor device should have a wide range of operations that depend on levels of the power supply voltage VDD. However, existing buffers have difficulties in generating a stable output signal that corresponds to the input signal IN since its operation state varies with characteristics of transistors, regardless of a level of the power supply voltage VDD.

In general, the PMOS transistor and NMOS transistor have a current-driving capacity that varies depending on a level of the power supply voltage VDD. Specifically, the PMOS transistor and NMOS transistor have the following characteristics: if the power supply voltage VDD has a relatively high level, the PMOS transistor has a surplus current-driving capacity; and if the power supply voltage VDD has a relatively low level, the NMOS transistor has a deficient current-driving capacity. This characteristic causes a variation in the duty rate of the output signal from the buffer. Therefore, the existing buffer of such structure varies the duty rate of the output signal depending on a level of the power supply voltage VDD, i.e., causes generation of distortion, which acts as a factor that degrades the performance and reliability of the semiconductor device. Particularly, this problem becomes more serious if noise occurs in the reference voltage V_REF which is the internal power supply voltage.

SUMMARY OF THE INVENTION

An embodiment of the present invention is directed to providing a semiconductor device capable of adjusting a current-driving capacity for deriving an output terminal depending on a level of a power supply voltage applied to buffers that are provided therein and connected in a cross-coupled manner.

Another embodiment of the present invention is directed to providing a semiconductor device capable of controlling buffers that are connected in a cross-coupled manner by a reference voltage corresponding to a transition time of an input signal.

In accordance with an embodiment of the present invention, there is provided a semiconductor device including a buffer unit configured to include first and second buffers, connected to each other in a cross-coupled manner, to receive a reference voltage and to buffer an input signal applied to the first and second buffers based on the reference voltage to drive an output terminal with a current-driving capacity; and a drive power adjustor configured to adjust the current-driving capacity depending on a level of a power supply voltage applied to the buffering unit.

The semiconductor device may further include a level compensator configured to compensate for a variation in a level of the reference voltage by controlling the first and second buffers based on the reference voltage.

The semiconductor device may further include a feedback signal generator configured to generate a feedback signal corresponding to the input signal by using an output from the output terminal; and a feedback unit configured to control the first and second buffers based on the feedback signal.

In accordance with another embodiment of the present invention, there is provided a semiconductor device including a buffer unit configured to include first and second buffers, connected to each other in a cross-coupled manner, to receive a reference voltage and to buffer an input signal applied to the first and second buffers based on the reference voltage to drive an output terminal by a pull-up/pull-down current-driving capacity; and a supplementary drive unit configured to drive the output terminal by a supplementary pull-up/pull-down current-driving capacity depending on a level of a power supply voltage applied to the buffering unit.

The semiconductor device may further include a control signal generator configured to generate a control signal corresponding to the level of the power supply voltage.

The supplementary drive unit may include a supplementary pull-up driver configured to reflect the supplementary pull-up current-driving capacity at the output terminal in response to the control signal; and a supplementary pull-down driver configured to reflect the supplementary pull-down current-driving capacity at the output terminal in response to the control signal.

The supplementary pull-up driver may include a first supplementary pull-up driver configured to apply a supplementary pull-up current corresponding to the reference voltage to the second buffer; and a second supplementary pull-up driver configured to drive the output terminal by a supplementary pull-up current corresponding to the input signal.

The first supplementary pull-up driver may include a current generator configured to generate the supplementary pull-up current corresponding to the reference voltage; and a transfer gate configured to transfer the supplementary pull-up current to the second buffer in response to the control signal.

The second supplementary pull-up driver may include a current generator configured to generate the supplementary pull-up current corresponding to the input signal; and a transfer gate configured to transfer the supplementary pull-up current to the output terminal in response to the control signal.

The semiconductor device may further include a fuse part configured to control whether or not to activate the control signal generator.

The semiconductor device may further include a level compensator configured to compensate for a variation in a level of the reference voltage by controlling the first and second buffers based on the reference voltage.

The semiconductor device may further include a feedback signal generator configured to generate a feedback signal corresponding to the input signal by using an output from the output terminal; and a feedback unit configured to control the first and second buffers based on the feedback signal.

In the present invention, it is possible to adjust a current-driving capacity for deriving an output terminal depending on a level of a power supply voltage applied to buffers that are provided therein and connected in a cross-coupled manner. Thus, the semiconductor device of the present invention may always secure a predetermined duty rate although various levels of power supply voltage are applied thereto. Moreover, the semiconductor device of the present invention controls buffers connected in a cross-coupled manner by a reference voltage corresponding to a transition time of the input signal, thereby ensuring a stable operation even if noise occurs in the reference voltage.

DESCRIPTION OF SPECIFIC EMBODIMENTS

Hereinafter, the most preferred embodiment of the present invention will be described in detail with reference to the accompanying drawings so that the invention may be easily carried out by those skilled in the art to which the invention pertains.

Figure 1:
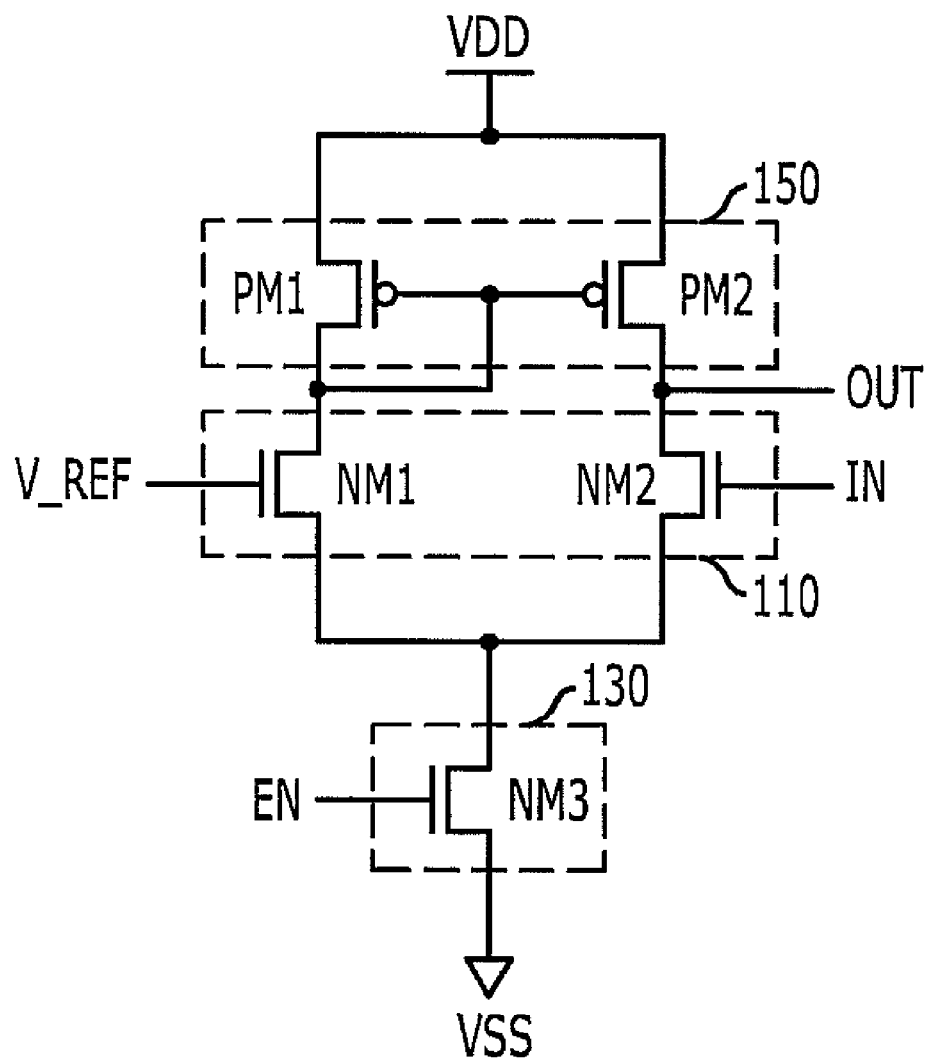
FIG. 1 is a circuit diagram for explaining a conventional buffer.
Figure 2:
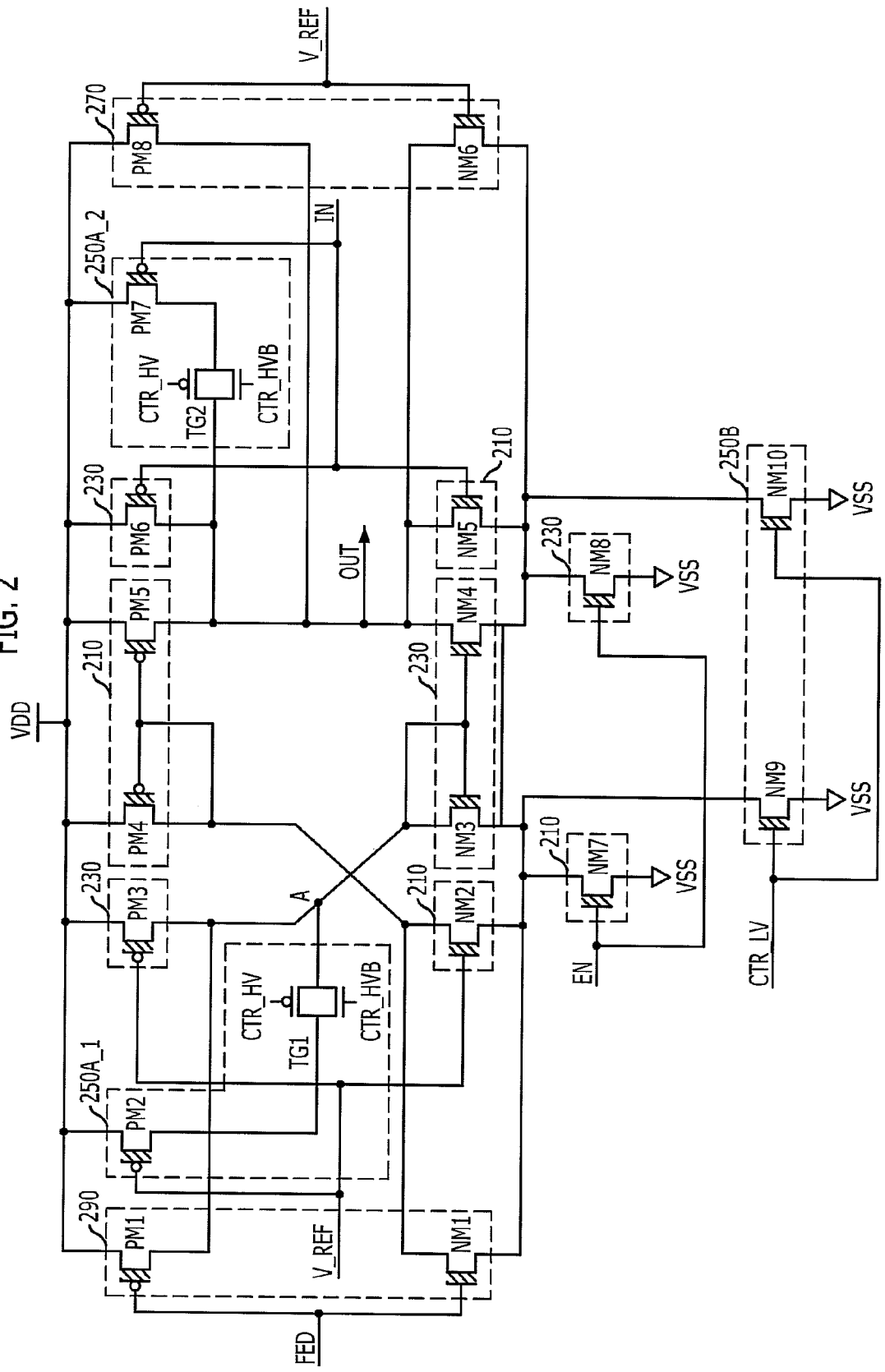
FIG. 2 is a block diagram illustrating a buffer unit for a semiconductor device in accordance with the present invention.

FIG. 2 illustrates a circuit diagram of a buffer unit in accordance with the present invention.

Referring to FIG. 2, the buffer unit of the present invention includes first and second buffers 210 and 230, a drive power adjustor 250A_1, 250A_2, and 250B, a level compensator 270, and a feedback unit 290. In the buffer unit of the present invention, the first and second buffers 210 and 230 are connected in a cross-coupled manner. The buffers 210 and 230 buffer an input signal IN applied thereto, and drive an output terminal OUT with a current-driving capacity.

Hereinafter, a detailed configuration of each of the first and second buffers 210 and 230 will be described.

The first buffer 210 is provided with fourth and fifth PMOS transistors PM4 and PM5, and second, fifth and seventh NMOS transistors NM2, NM5 and NM7.

Here, the fourth PMOS transistor PM4 has a source-drain path connected between a power supply voltage VDD terminal and the second NMOS transistor NM2, and a drain and a gate connected to each other. The fifth PMOS transistor PM5 has a source-drain path connected between the power supply voltage VDD terminal and the output terminal OUT, and a gate connected to the gate of the fourth PMOS transistor PM4. The second NMOS transistor NM2 has a source-drain path connected between the fourth NMOS transistor NM4 and the seventh NMOS transistor NM7, and a gate receiving a reference voltage V_REF. The fifth NMOS transistor NM5 has a source-drain path connected between the fifth PMOS transistor PM5 and an eighth NMOS transistor NM8, and a gate receiving the input signal IN. Lastly, the seventh NMOS transistor NM7 has a source-drain path connected between the second NMOS transistor NM2 and the ground voltage VSS terminal, and a gate receiving an activation signal EN.

The second buffer 230 is provided with third and sixth PMOS transistors PM3 and PM6, and third, fourth and eighth NMOS transistors NM3, NM4 and NM8.

Here, the third PMOS transistor PM3 has a source-drain path connected between the power supply voltage VDD terminal and the third NMOS transistor NM3, and a gate receiving the reference voltage V_REF. The sixth PMOS transistor PM6 has a source-drain path connected between the power supply voltage VDD terminal and the output terminal OUT, and a gate receiving the input signal IN. The third NMOS transistor NM3 has a source-drain path connected between the third PMOS transistor PM3 and the seventh NMOS transistor NM7, wherein its drain and gate are connected to each other. The fourth NMOS transistor NM4 has a source-drain path connected between the sixth PMOS transistor PM6 and the eighth NMOS transistor NM8, and a gate connected to the gate of the third NMOS transistor NM3. Lastly, the eighth NMOS transistor NM8 has a source-drain path connected between the fourth NMOS transistor NM4 and the ground voltage VSS terminal, and a gate receiving the activation signal EN. Here, the activation signal EN applied to the seventh NMOS transistor NM7 and the eighth NMOS transistor NM8 is for activating the buffering operation of the first and second buffers 210 and 230.

Hereinafter, a current-driving capacity used for making the output terminal OUT to be pulled-up is called 'pull-up current-driving capacity', and a current-driving capacity used for making the output terminal OUT to be pulled-down is called 'pull-down current-driving capacity.' That is, the first and second buffers 210 and 230 of the present invention buffer the input signal IN in response to the reference voltage V_REF and drive the output terminal OUT by a pull-up/pull-down current-driving capacity.

The drive power adjustor 250A_1, 250A_2, and 250B is for adjusting a current-driving capacity for driving the output terminal OUT depending on a level of the power supply voltage VDD applied to the first and second buffers 210 and 230, and is provided with first and second supplementary pull-up drivers 250A_1 and 250A_2 and a supplementary pull-down driver 250B. In other words, in accordance with the present invention, the output terminal OUT is driven by the first and second buffers 210 and 230 with the pull-up/pull-down current-driving capacity, and further by a supplementary pull-up/pull-down current-driving capacity generated by the first and second supplementary pull-up drivers 250A_1 and 250A_2 and the supplementary pull-down driver 250B depending on a level of the power supply voltage VDD. That is, the first and second supplementary pull-up drivers 250A_1 and 250A_2 reflect the supplementary pull-up current-driving capacity at the output terminal OUT, and the supplementary pull-down driver 250B reflects the supplementary pull-down current-driving capacity at the output terminal OUT.

The first supplementary pull-up driver 250A_1 is for applying a supplementary pull-up current corresponding to the reference voltage V_REF to the second buffer 230, and is provided with a first current generator PM2 and a first transfer part TG1. Here, the first current generator PM2 is for generating the supplementary pull-up current corresponding to the reference voltage V_REF, and is composed of a second PMOS transistor PM2 having a source-drain path between the power supply voltage VDD terminal and the first transfer part TG1 and a gate receiving the reference voltage V_REF. The first transfer part TG1 is for transferring the supplementary pull-up current generated by the first current generator PM2 to node A in response to first positive/negative control signals CTR_HV and CTR_HVB, and is composed of a first transfer gate TG1.

The second supplementary pull-up driver 250A_2 is for applying a supplementary pull-up current corresponding to the input signal IN to the output terminal OUT, and is composed of a second current generator PM7 and a second transfer part TG2. Here, the second current generator PM7 is for generating the supplementary pull-up current corresponding to the input signal IN, and is composed of a seventh PMOS transistor PM7 having a source-drain path formed between the power supply voltage VDD terminal and the second transfer part TG2 and a gate receiving the input signal IN. The second transfer part TG2 is for transferring the supplementary pull-up current generated by the second current generator PM7 to the output terminal OUT in response to first positive/negative control signals CTR_HV and CTR_HVB, and is composed of a second transfer gate TG2.

A generation circuit and logic level value for the first positive/negative control signals CTR_HV and CTR_HVB will be described again with reference to FIGS. 3 to 5. In brief, when the power supply voltage VDD has a relatively low level, the first positive control signal CTR_HV becomes logic 'low' and the first negative control signal CTR_HVB becomes logic 'high'. In this case, the second and sixth PMOS transistors PM2 and PM7 generate the supplementary pull-up current that is responsive to the reference voltage V_REF and the input signal IN, and thus the first and second transfer gates TG1 and TG2 transfer the supplementary pull-up current to the node A and the output terminal OUT.

Meanwhile, when the power supply voltage VDD has a relatively high level, the first positive control signal CTR_HV becomes logic 'high' and the first negative control signal CTR_HVB becomes logic 'low'. In this case, the supplementary pull-up current is not reflected at the node A and the output terminal OUT. That is, in accordance with the present invention, when the power supply voltage VDD has a relatively high level, it is possible to attenuate the current-driving capacity reflected at the output terminal OUT by the PMOS transistors. Here, the relatively low level and the relatively high level may be distinguished from each other based on characteristic of the PMOS transistors. That is, the present invention attenuates the current-driving capacity of the PMOS transistors at a point of time when it is superfluous, thereby making the stable pull-up current-driving capacity reflected at the output terminal OUT.

The supplementary pull-down driver 250B is for reflecting a supplementary pull-down current-driving capacity at the output terminal OUT in response to the second control signal CTR_LV, and is composed of a ninth NMOS transistor NM9 connected in parallel with the seventh NMOS transistor NM7 and having a gate receiving the second control signal CTR_LV, and a tenth NMOS transistor NM10 connected in parallel with the eighth NMOS transistor NM8 and having a gate receiving the second control signal CTR_LV.

A generation circuit and logic level value for the second control signal CTR_LV will also be described again with reference to FIGS. 3 to 5. In brief, when the power supply voltage VDD has a relatively low level, the second control signal CTR_LV becomes logic 'high'. In this case, the ninth and tenth NMOS transistors NM9 and NM10 are turned on, and a supplementary pull-down current generated therefrom is reflected at the output terminal OUT.

Meanwhile, when the power supply voltage VDD has a relatively high level, the second control signal CTR_LV becomes logic 'low'. In this case, the ninth and tenth NMOS transistors NM9 and NM10 are turned off, and a supplementary pull-down current generated therefrom is not reflected at the output terminal OUT. That is, in accordance with the present invention, when the power supply voltage VDD has a relatively low level, it is possible to enhance the current-driving capacity reflected at the output terminal OUT by the NMOS transistors. Here, the relatively low level and the relatively high level may be distinguished from each other based on characteristic of the NMOS transistors. That is, the present invention increases the current-driving capacity of the NMOS transistors at a point of time when it is deficient, thereby rendering the stable pull-down current-driving capacity reflected at the output terminal OUT.

Figure 3:
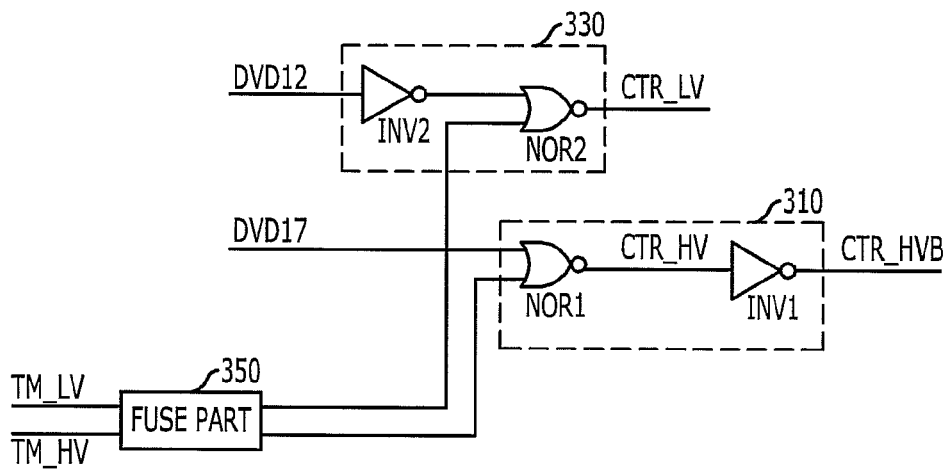
FIG. 3 illustrates a detailed circuit diagram of the control signal generator for generating the first positive/negative control signals CTR_HV and CTR_HVB and the second control signal CTR_LV in FIG. 2.

FIG. 3 illustrates a detailed circuit diagram of a control signal generation unit which generates the first positive/negative control signals CTR_HV and CTR_HVB and the second control signal CTR_LV depicted in FIG. 2.

Referring to FIG. 3, the control signal generation unit is for generating the first positive/negative control signals CTR_HV and CTR_HVB and the second control signal CTR_LV corresponding to a level of the power supply voltage VDD, and is provided with first and second control signal generators 310 and 330, and a fuse part 350.

The first control signal generator 310 is for generating the first positive/negative control signals CTR_HV and CTR_HVB in response to a first detection signal DVD17, and is composed of a first NOR gate NOR1 for outputting the first positive control signal CTR_HV in response to the first detection signal DVD17 and an output signal from the fuse part 350, and a first inverter INV1 for outputting the first negative control signal CTR_HVB in response to the first positive control signal CTR_HV.

The second control signal generator 330 is for generating the second control signal CTR_LV in response to a second detection signal DVD12, and is composed of a second inverter INV2 receiving the second detection signal DVD12, and a second NOR gate NOR2 for outputting the second control signal CTR_LV in response to an output signal from the second inverter INV2 and an output signal from the fuse part 350.

Meanwhile, the first and second control signal generators 310 and 330 may be activated or inactivated in response to an output signal from the fuse part 350. Here, the fuse part 350 generates an output signal corresponding to first and second test signals TM_HV and TM_LV, which may have a signal generated from the outside or within the chip, e.g., a logic level value depending on a normal mode and a test mode.

In the embodiment of FIG. 3, when an output signal from the fuse part 350 is logic 'low', the first and second control signal generators 310 and 330 are activated to generate the first positive/negative control signals CTR_HV and CTR_HVB and the second control signal CTR_LV in response to the first and second detection signals DVD17 and DVD12. Thus, the supplementary pull-up/pull-down drive power corresponding to the power supply voltage VDD is reflected at the output terminal OUT.

Meanwhile, when an output signal from the fuse part 350 is logic 'high', the first and second control signal generators 310 and 330 are inactivated and thus the first and second transfer gates TG1 and TG2 and ninth and tenth NMOS transistors NM9 and NM10 are turned off, so that the supplementary current-driving capacity is not reflected at the output terminal OUT.

The present invention analyzes characteristic of the buffers in test mode, and thus cuts off a fuse included in the fuse part 350. Therefore, the present invention may keep the first positive/negative control signals CTR_HV and CTR_HVB and the second control signal CTR_LV at the predetermined level, or output them in response to the first and second detection signals DVD17 and DVD12 in normal mode. Accordingly, the first and second buffers 210 and 230 may drive the output terminal OUT by an appropriate current-driving capacity depending on a level of the power supply voltage VDD.

Figure 4:
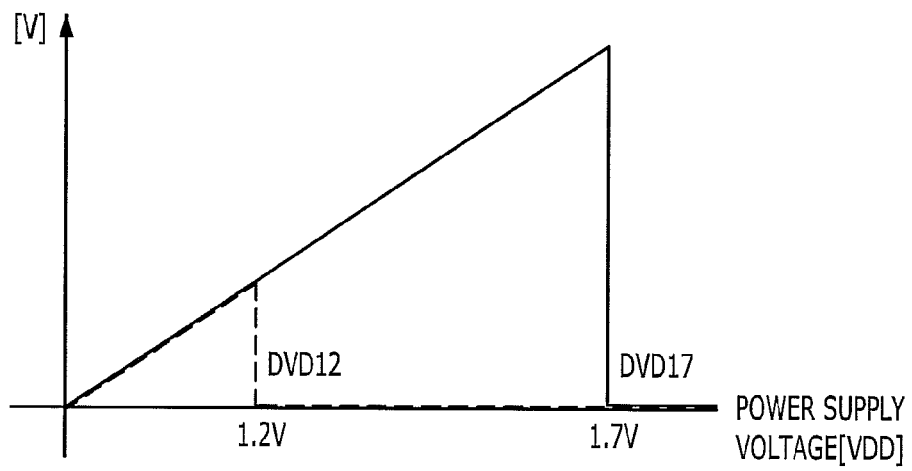
FIG. 4 is a view illustrating detection of the first and second detection signals DVD17 and DVD12 depicted in FIG. 3.

FIG. 4 is a view illustrating detection of the first and second detection signals DVD17 and DVD12 depicted in FIG. 3. For illustration purposes, it is illustrated that the first and second detection signals DVD17 and DVD12 are detected at points of time when a level of the power supply voltage VDD becomes 1.2 V and 1.7 V.

Referring to FIG. 4, in an interval where a level of the power supply voltage VDD is below 1.2 V, the second detection signal DVD12 has a voltage level corresponding to a level of the power supply voltage VDD and has a value corresponding to logic 'low' at a point of time when a level of the power supply voltage VDD is above 1.2 V. Also, in an interval where a level of the power supply voltage VDD is below 1.7 V, the first detection signal DVD17 has a voltage level corresponding to a level of the power supply voltage VDD and has a value corresponding to logic 'low' at a point of time when a level of the power supply voltage VDD is above 1.7 V.

Figure 5:
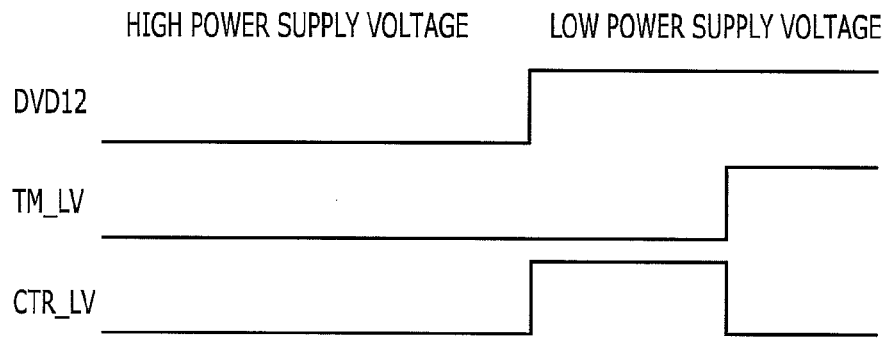
FIGS. 5 and 6 are timing diagrams for explaining a relationship among respective signals of FIG. 3.
Figure 6:
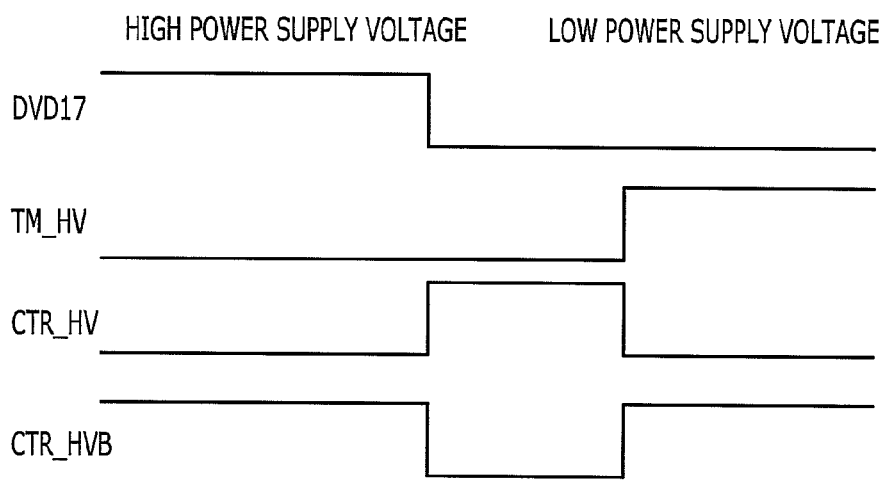

FIGS. 5 and 6 are timing diagrams for explaining a relationship among respective signals of FIG. 3. For illustration purposes, it is assumed that the output signal of the fuse part 350 has the same level as the first and second test signals TM_HV and TM_LV inputted thereto.

Referring to FIGS. 3 to 5, the second detection signal DVD12 becomes logic 'high' when the power supply voltage VDD has a relatively low voltage level, e.g., below 1.2 V, and thus the second control signal CTR_LV becomes logic 'high'. The second control signal CTR_LV so generated activates the ninth and tenth NMOS transistors NM9 and NM10 when the power supply voltage VDD has a relatively low level. Thus, the first and second buffers 210 and 230 in accordance with the present invention may increase the current-driving capacity of the NMOS transistors at lower power supply voltage VDD.

Meanwhile, the second control signal CTR_LV is controlled by the second test signal TM_LV, and when the second test signal TM_LV becomes logic 'high', the second control signal CTR_LV is inactivated to logic 'low' regardless of the second detection signal DVD12 and thus the supplementary pull-down current-driving capacity corresponding to the ninth and tenth NMOS transistors NM9 and NM10 is not reflected at the output terminal OUT.

Referring to FIG. 6, the first detection signal DVD17 becomes logic 'low' when the power supply voltage VDD has a relatively high voltage level, e.g., above 1.7 V, and thus the first positive control signal CTR_HV becomes logic 'high' and the first negative control signal CTR_HVB becomes logic 'low'. The first positive/negative control signals CTR_HV and CTR_HVB so generated inactivates the first and second transfer gates TG1 and TG2 when the power supply voltage VDD has a relatively high level. Thus, the first and second buffers 210 and 230 in accordance with the present invention may decrease the current-driving capacity of the PMOS transistors at higher power supply voltage VDD.

Meanwhile, the first positive/negative control signals CTR_HV and CTR_HVB is controlled by the first test signal TM_HV, and when the first test signal TM_HV becomes logic 'high', the first positive/negative control signals CTR_HV and CTR_HVB are inactivated regardless of the first detection signal DVD17 and thus the supplementary pull-up current-driving capacity is not reflected at the output terminal OUT.

Referring again to FIG. 2, the level compensator 270 is for controlling the first and second buffers 210 and 230 by the reference voltage V_REF inputted thereto, and is provided with an eighth PMOS transistor PM8 having a source-drain path formed between the power supply voltage VDD terminal and the output terminal OUT and a gate receiving the reference voltage V_REF, and a sixth NMOS transistor NM6 having a source-drain path formed between the output terminal OUT and the eighth PMOS transistor PM8 and a gate receiving the reference voltage V_REF. Here, the level compensator 270 is for compensating noise which occurs in the reference voltage V_REF. The buffers in accordance with the present invention may secure a stable buffering operation through the above configuration.

The feedback unit 290 is for controlling the first and second buffers 210 and 230 by a feedback signal FED which is received from the output terminal OUT and corresponds to the input signal IN, and is provided with a first PMOS transistor PM1 having a source-drain path formed between the power supply voltage VDD terminal and the node A and a gate receiving the feedback signal FED, and a first NMOS transistor NM1 having source and drain terminals connected to source and drain terminals of the second NMOS transistor NM2 and a gate receiving the feedback signal FED. Here, the feedback unit 290 is for improving a gain of the input signal IN versus the output signal.

Figure 7:
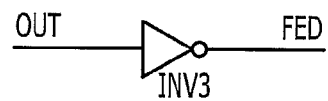
FIG. 7 is a detailed circuit diagram of the feedback signal generator which generates the feedback signal FED in FIG. 3.

FIG. 7 depicts a detailed circuit diagram of a feedback signal generator for generating the feedback signal FED in FIG. 3.

Referring to FIG. 7, the feedback signal generator is for outputting the feedback signal FED by using an output from the output terminal OUT (see FIG. 2), and is provided with a third inverter INV3 for generating the feedback signal FED by the output from the output terminal OUT.

As described above, the semiconductor memory device in accordance with the present invention may adjust a current-driving capacity for driving the output terminal OUT depending on a level of the power supply voltage VDD applied to the buffers, thereby generating an output signal with a constant duty rate all the time although a level of the power supply voltage is varied. The output signal with a constant duty rate contributes to improvement in the performance and reliability of the semiconductor device.

In addition, the semiconductor device in accordance with the present invention compensates for noises occurring in the reference voltage V_REF by controlling the buffers based on the reference voltage V_REF, and thus may guarantee a stable buffering operation.

Moreover, the semiconductor memory device in accordance with the present invention may decrease the current-driving capacity by the PMOS transistors when the power supply voltage VDD has a relatively high level. The decreased current-driving capacity may minimize power being consumed in the buffers.

Although the present invention has been described with respect to the particular embodiment which adjusts the pull-up current-driving capacity and pull-down current-driving capacity by way of example, it may also be applied to an instance which adjusts the pull-up or pull-down current-driving capacity.

It should be noted that the logic gates and transistors exemplified in the above embodiments may be arranged in different places and implemented in different types based on polarities of input signals.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a buffer unit configured to include first and second buffers, connected to each other in a cross-coupled manner, to receive a reference voltage and to buffer an input signal applied to the first and second buffers based on the reference voltage to drive an output terminal with a current-driving capacity; and
   a drive power adjustor configured to adjust the current-driving capacity depending on a level of a power supply voltage applied to the buffering unit.

2. The semiconductor device as recited in claim 1, further comprising:
   a level compensator configured to compensate for a variation in a level of the reference voltage by controlling the first and second buffers based on the reference voltage.

3. The semiconductor device as recited in claim 1, further comprising:
   a feedback signal generator configured to generate a feedback signal corresponding to the input signal by using an output from the output terminal; and
   a feedback unit configured to control the first and second buffers based on the feedback signal.

4. A semiconductor device, comprising:
   a buffer unit configured to include first and second buffers, connected to each other in a cross-coupled manner, to receive a reference voltage and to buffer an input signal applied to the first and second buffers based on the reference voltage to drive an output terminal with a pull-up/pull-down current-driving capacity; and
   a supplementary drive unit configured to drive the output terminal by a supplementary pull-up/pull-down current-driving capacity depending on a level of a power supply voltage applied to the buffering unit.

5. The semiconductor device as recited in claim 4, further comprising:
   a control signal generator configured to generate a control signal corresponding to the level of the power supply voltage.

6. The semiconductor device as recited in claim 5, wherein the supplementary drive unit includes:
   a supplementary pull-up driver configured to reflect the supplementary pull-up current-driving capacity at the output terminal in response to the control signal; and
   a supplementary pull-down driver configured to reflect the supplementary pull-down current-driving capacity at the output terminal in response to the control signal.

7. The semiconductor device as recited in claim 6, wherein the supplementary pull-up driver includes:
   a first supplementary pull-up driver configured to apply a supplementary pull-up current corresponding to the reference voltage to the second buffer; and
   a second supplementary pull-up driver configured to drive the output terminal by a supplementary pull-up current corresponding to the input signal.

8. The semiconductor device as recited in claim 7, wherein the first supplementary pull-up driver includes:
   a current generator configured to generate the supplementary pull-up current corresponding to the reference voltage; and
   a transfer gate configured to transfer the supplementary pull-up current to the second buffer in response to the control signal.

9. The semiconductor device as recited in claim 7, wherein the second supplementary pull-up driver includes:
- a current generator configured to generate the supplementary pull-up current corresponding to the input signal; and
- a transfer gate configured to transfer the supplementary pull-up current to the output terminal in response to the control signal.

10. The semiconductor device as recited in claim 5, further comprising:
- a fuse part configured to control whether or not to activate the control signal generator.

11. The semiconductor device as recited in claim 4, further comprising:
- a level compensator configured to compensate for a variation in a level of the reference voltage by controlling the first and second buffers based on the reference voltage.

12. The semiconductor device as recited in claim 4, further comprising:
- a feedback signal generator configured to generate a feedback signal corresponding to the input signal by using an output from the output terminal; and
- a feedback unit configured to control the first and second buffers based on the feedback signal.

* * * * *